(12) United States Patent
Tanoue et al.

(10) Patent No.: US 7,368,996 B2
(45) Date of Patent: May 6, 2008

(54) HIGH FREQUENCY POWER AMPLIFIER

(75) Inventors: Tomonori Tanoue, Machida (JP);
Masami Ohnishi, Hachioji (JP);
Hidetoshi Matsumoto, Kokubunji (JP);
Akira Kuriyama, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 293 days.

(21) Appl. No.: 11/209,692

(22) Filed: Aug. 24, 2005

(65) Prior Publication Data
US 2007/0176687 A1    Aug. 2, 2007

(30) Foreign Application Priority Data
Sep. 30, 2004  (JP) ............................. 2004-286998
Aug. 2, 2005   (JP) ............................. 2005-223902

(51) Int. Cl.
*H03F 3/45* (2006.01)
(52) U.S. Cl. .................................. 330/301; 330/302
(58) Field of Classification Search ................ 330/301, 330/302, 311
See application file for complete search history.

(56) References Cited
U.S. PATENT DOCUMENTS
4,945,317 A * 7/1990 Sato et al. .................. 330/301

6,420,937 B1    7/2002  Akatsuka et al. ............. 331/74
6,937,097 B2 *  8/2005  Joo et al. ..................... 330/252

FOREIGN PATENT DOCUMENTS
JP    2002-076954    3/2002
JP    2002-164797    6/2002

* cited by examiner

*Primary Examiner*—Steven J. Mottola
(74) *Attorney, Agent, or Firm*—Miles & Stockbridge P.C.

(57) ABSTRACT

Disclosed is a power amplifier having highly stable and excellent controllability, and having low noise in comparison with conventional power amplifiers. With the power amplifier, a differential amplifier made up of transistors Q1, Q2 is provided in the initial stage thereof, and baluns doubling as inter-stage matching circuits, comprised of Cp1, Cp2, Lp1, and Ct1, Ct2, Lt1, respectively, are provided between the initial stage, and a second stage while an unbalanced single-ended circuit is provided in the second stage. The differential amplifier has an emitter-coupled type configuration for coupling both emitters with each other, and output control of the amplifier in the initial stage is executed by varying current of a current source coupled to both the emitters.

4 Claims, 8 Drawing Sheets

PRIOR ART

HIGH FREQUENCY POWER AMPLIFIER

CLAIM OF PRIORITY

The present application claims priority from Japanese applications JP 2004-286998 filed on Sep. 30, 2004, and JP 2005-223902 filed on Aug. 2, 2005, the contents of which are hereby incorporated by reference into this application.

FIELD OF THE INVENTION

The invention relates to a high frequency power amplifier for use in a high frequency mobile communications terminal, and in particular, to a high frequency power amplifier for a differential input, achieving reduction in output noise power, and power control gradient.

BACKGROUND OF THE INVENTION

Figure 4:
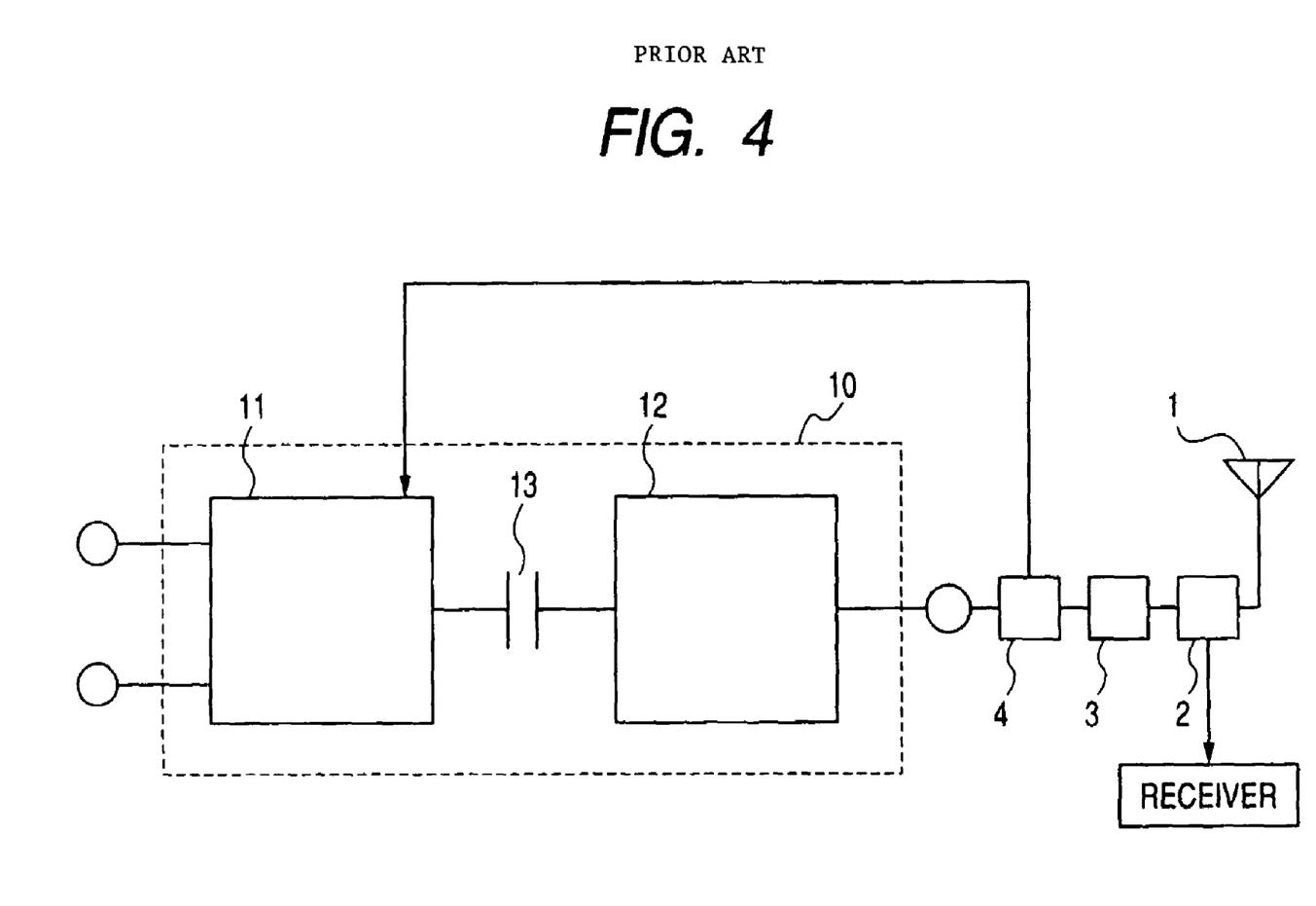
FIG. 4 is a block diagram showing an example of a conventional power amplifier.

With reference to this type of a conventional power amplifier, there has since been known a configuration disclosed in JP-A No. 76954/2002 (Patent Document 1). FIG. 4 is a block diagram showing the configuration. A power amplifier 10 comprises a differential amplifier 11, a single amplifier 12, and a capacitor 13, and the output side of the differential amplifier 11 is coupled with the input side of the single amplifier 12 via the capacitor 13. In FIG. 4, reference numeral 1 denotes an antenna, 2 a filter, 3 an isolator, and 4 a coupler.

Figure 5:
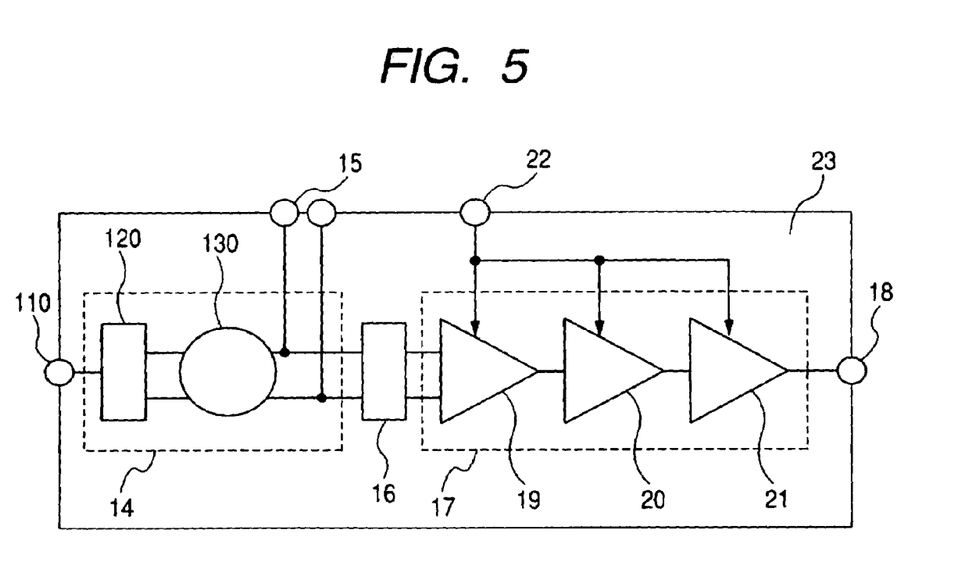
FIG. 5 is a block diagram showing another example of the conventional power amplifier.

Further, as a structure of another conventional high frequency power amplifier, a high output voltage control oscillator has been disclosed in JP-A No. 164797/2002 (Patent Document 2). FIG. 5 is a block diagram thereof. The high output voltage control oscillator has a configuration where there are provided an input terminal 110 to which a control voltage is delivered, a voltage control oscillator 14 to which the control voltage delivered to the input terminal 110 is supplied, a power amplification unit 17 which an output of the voltage control oscillator 14 is supplied to, and is made up of a plurality of amplification circuits 19 to 21, connected in series, and an output terminal 18 to which an output of the power amplification unit 17 is supplied, and the voltage control oscillator 14, and at least the amplification circuit 19 in the initial stage of the power amplification unit 17 are made up of a balanced amplification circuit, respectively, while a balanced-to-unbalanced conversion circuit (balun) is provided inside the power amplification unit 17. In FIG. 5, reference numeral 15 denotes an output terminal of the voltage control oscillator, 16 a matching circuit, 120 a resonance circuit, 130 the balanced amplification circuit, 22 a power control terminal, and 23 a package.

[Patent Document 1] JP-A No. 76954/2002
[Patent Document 2] JP-A No. 164797/2002

SUMMARY OF THE INVENTION

With a power amplifier for use in a high frequency mobile communications terminal, there is the need for amplifying an output signal of an amplifier in a preceding stage, at around 0 dBm, up to not less than an antenna output. Particularly, in the case of a power amplifier for use as a terminal for GSM (Global System for Mobile Communications), an antenna output on the order of 33 dBm is required. Taking into account losses due to a filter and a switch that are inserted between the power amplifier, and an antenna, being not less than about 1 dB, the output not less than 34 dBm is required. That is, there is the need for power gain of not less than about 34 dB at the minimum. Further, in the case of the GSM method, because no linearity is required of the output of the power amplifier, the power amplifier is generally used with the output thereof after being saturated, in order to enhance efficiency. Accordingly, it is a general practice to cause a linear gain of the power amplifier to fall in the range of about 39 to 44 dB, higher by 5 to 10 dB than the minimum requirement at 34 dB. Hence, the power amplifier for use as the terminal for the GSM method is normally made up of a three-stage amplifier as disclosed in JP-A No. 164797/2002 However, the more the number of stages of an amplifier, the more difficult it generally becomes to effect phase compensation, and oscillation becomes more prone to occur. For this reason, the three-stage amplifier for use in the GSM method has had a problem in that the same is prone to undergo oscillation, and miniaturization thereof is difficult to implement in comparison with a two-stage amplifier in use as a terminal for CDMA (Code Division Multiple Access) method, and so forth.

Further, with the power amplifier having such a high gain as described, output noise also increases. Owing to the necessity for reducing extraneous radiation at a terminal of communications, in particular, extraneous radiation in a receive frequency (hereinafter referred to as Rx) band at the terminal, the maximum value of the output noise is specified. According to the specification of the GSM method, the radiation in the Rx band at the terminal is specified as not more than −79 dBm/100 kHz at the maximum.

In the mobile communications, a transmit frequency (hereinafter referred to as Tx) is generally in the range of about several hundred MHz to 2 GHz. Meanwhile, the transmit frequency Tx band at the terminal is apart from the Rx band by on the order of several tens of MHz only (20 MHz in the case of the GSM method). Accordingly, an amplifier gain and a noise factor (hereinafter referred to as NF) of the power amplifier, in the Rx band at the terminal, are substantially equal to those in the Tx band. Therefore, by multiplying (summing up in terms of dB) together the power gain, and NF of the power amplifier, in the Tx band, it is possible to find a lower limit of noise power occurring in the Rx band.

Since the gain of the power amplifier for the GSM method is in the range of about 39 to 44 dB, as previously described, and thermal noise at room temperature is at −124 dBm/100 kHz, the noise factor in the range of 1 to 6 dB (if PG=39 dB, NF $\leq$ 6 dB from −124+NF+39$\leq$−79) is required to meet the specification of −79 dBm/100 kHz. The noise factor described is large in value as compared with that (0.5 to 2 dB in the vicinity of 1 GHz) of a common low noise amplifier, however, in noise designing for the power amplifier, it is difficult to apply normal noise reduction techniques executed in the common low noise amplifier, so that it is not easy to implement the noise factor in the range of 1 to 6 dB by normal designing.

The reason why it is difficult to apply the normal noise reduction techniques (matching of inputs so as to minimize noise, and current in the initial stage is minimized in order to reduce shot noise proportional to the current) to the power amplifier is as follows. First, because minimum noise matching, and non-reflective matching are generally differ in matched impedance from each other, there is a possibility that in the minimum noise matching, reflecting power returns from an amplifier in the initial stage of the power amplifier toward an amplifier in a preceding stage, thereby raising a possibility of inducing an unstable operation in the preceding stage. Further, the current in the initial stage is dependent on an output required in the initial stage, and sufficient output in the initial stage cannot be obtained by a low current operation as with the case of the low noise amplifier.

Thus, with reference to the noise in the Rx band of the power amplifier for the GSM method, there occurs noise dependent only on the normal noise factor, that is, the noise close to the specified value for the GSM method. In addition, due to a saturation operation of the power amplifier, there occurs an additional noise that does not occur to a linear amplifier. The additional noise is described hereinafter. Execution of the saturation operation, that is, nonlinear operation by an amplifier causes frequency conversion to occur due to the same effect as that of a frequency mixer. More specifically, a low frequency (for example, 20 MHz) noise signal from a bias circuit of a transistor, or a low frequency noise signal from a transistor itself is mixed with a high frequency signal delivered from an input terminal of the amplifier, thereby generating a signal at a frequency corresponding to the sum of both the frequencies, or the difference between both the frequencies.

Now, in the case of the GSM method, since the difference between the highest frequency in the Tx band, and the lowest frequency in the Rx band is 20 MHz as previously described, if a Tx signal, and a noise signal at 20 MHz are converted into a signal at a sum frequency thereof, such a signal becomes a noise at an Rx band frequency. Accordingly, with the power amplifier, there is the need for reducing a frequency-conversion noise due to nonlinearity thereof, however, the conventional amplifier has had a problem with difficulty in reducing the noise described.

Further, a problem has been encountered in that output controllability of the power amplifier according to the GSM method is prone to fall into a state of control gradient being excessive, that is, such a state where an output undergoes a large change depending on a slight change in the control voltage, and particularly, if output control is applied to all amplification stages of the three-stage amplifier, the control gradient is increased by three times, so that the output controllability is prone to lapse into a state of the control gradient being particularly excessive.

To cope with requirements for overcoming the problems described as above, in JP-A NO. 76954/2002 (Patent Document 1), there has been disclosed a technology for reducing distortion occurring to signals for the CDMA method by adopting the configuration where a differential amplifier is provided in the initial stage, and a single-ended amplifier is provided in a back-end stage, thereby making adjustment such that a tertiary distortion occurring to the initial stage and a tertiary distortion occurring to the back-end stage are rendered substantially equal in amplitude to each other, but opposite in sign from each other. The technology described, however, is a technology relating to a linear amplifier for the CDMA method, but not a technology taking into consideration the GSM method undergoing the saturation operation. Further, a mechanism in which the low frequency noise is mixed with the high frequency signal in the Tx band to become the noise in an Rx band represents an effect for distortion of an even-number order, such a secondary order or a quaternary order as described later, but does not represent an effect for the tertiary distortion. Consequently, the conventional examples hardly contribute to reduction in the noise in the Rx band. Further, the power amplifier for the CDMA method is generally used with its gain remaining constant, having therefore nothing to do with the steepness in the control gradient. Still further, because the power amplifier for the CDMA method is generally lower in gain than the amplifier for use in the GSM method, a problem of the oscillation is not particularly described.

In JP-A No. 164797/2002 (Patent Document 2) relating to the structure of another conventional high frequency power amplifier, there is disclosed the voltage control oscillator including the power amplification unit for the GSM method, however, the power amplification unit is the three-stage amplifier having the amplification stages 19, 20, 21, adopting a system for controlling each of the stages from the control terminal 22. Accordingly, problems have existed in that phase compensation is difficult to effect, and oscillation is prone to occur, and the voltage control oscillator is at a disadvantage in miniaturization as compared with the two-stage amplifier while the output controllability is prone to lapse into the state of the control gradient being excessive. Furthermore, nothing is described as to the reduction in the noise in Rx band.

Now, one of representative embodiments of the invention is shown as follows. That is, a high frequency power amplifier according to the invention, comprises an amplifier in the initial stage, made up of a differential amplifier, and a balun formed using circuits doubling as inter-stage matching circuits, comprised of passive elements, and provided between respective stages of the amplifier in the initial stage, and an amplifier in a second stage, wherein the amplifier in the second stage is made up of an unbalanced single-ended circuit. By providing the initial stage with the differential amplifier, and providing the balun comprised of the passive elements between the respective stages, an input-output transfer characteristics can be expressed by an odd function. As a result, it is possible to inhibit the effect of a low frequency signal being mixed with a high frequency signal in the Tx band to be converted into a signal at a frequency in the Rx band. Further, because power gain of 3 dB at the maximum can be obtained with the use of the balun, the power amplifier can be made up with two stages, so that it is possible to obtain an amplifier small in size, capable of ensuring oscillation stability. Furthermore, with the power amplifier of a two-stage configuration, an output in the initial stage is controlled by current of a current source, thereby enabling an amplifier with a mild control gradient to be implemented. With the high frequency power amplifier according to the invention, it is possible to obtain low noise as well as highly stable and excellent controllability.

DETAILED DESCRIPTION OF THE PREFERRED EMBODIMENTS

Embodiments of a high frequency power amplifier according to the invention are described in detail hereinafter with reference to the accompanying drawings.

Embodiment 1

Figure 1:
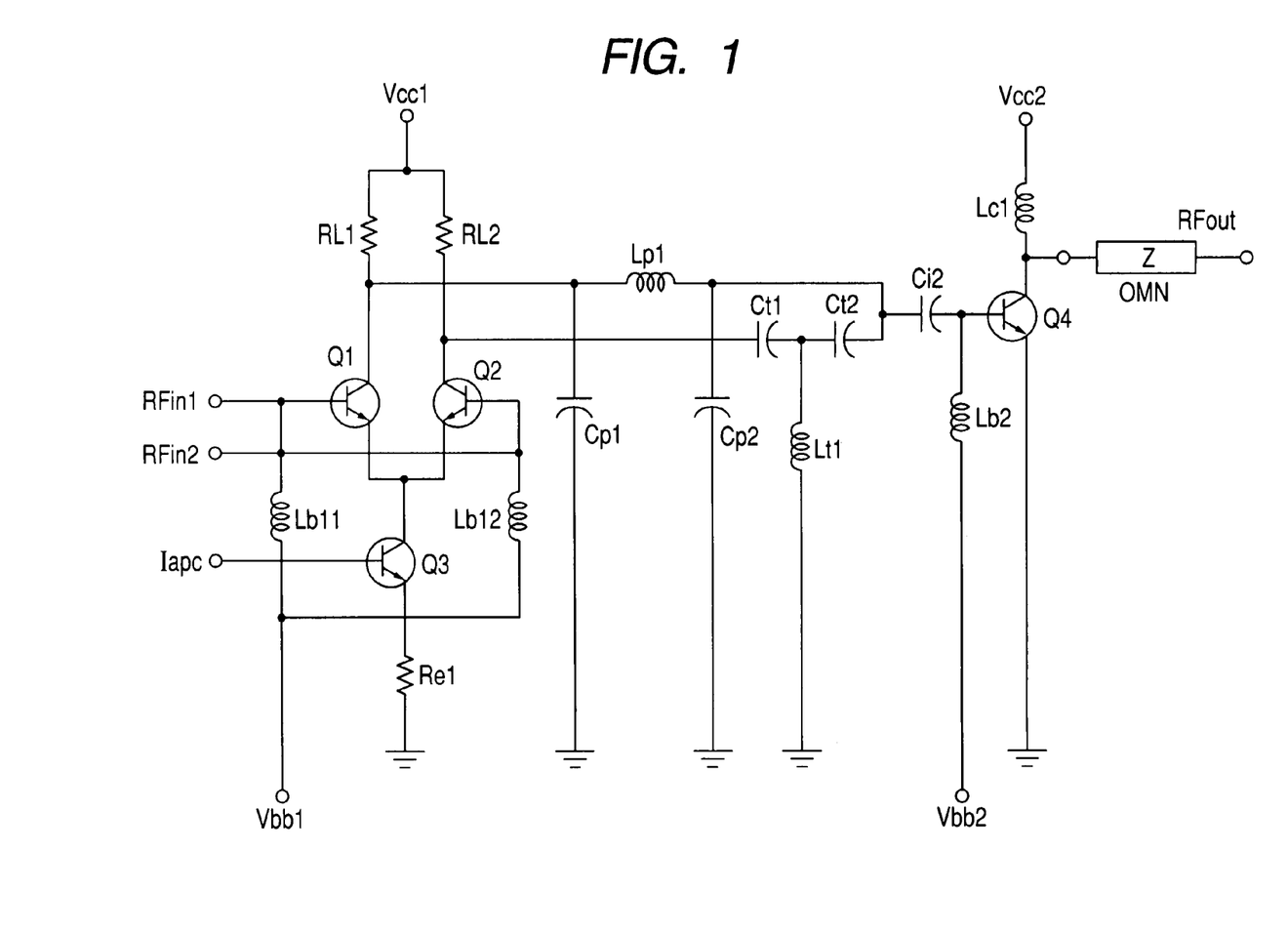
FIG. 1 is a circuit diagram of Embodiment 1 of a high frequency power amplifier according to the invention.

First, a configuration of Embodiment 1 of a high frequency power amplifier according to the invention is described with reference to a circuit diagram as shown in FIG. 1. In FIG. 1, reference numerals Rfin1, Rfin2 denote a positive-phase input terminal, and an opposite-phase input terminal, respectively, Q1, Q2 a signal amplification bipolar transistor in the initial stage, respectively, and Q3 denotes a current source transistor.

Further, Iapc denotes a control input terminal in the initial stage, RL1, RL2 denote a load resistor, respectively, Re1 denotes a current source resistor, Lb11, Lb12 a base-bias supply inductor in the initial stage, respectively, Vbb1, Vbb2 a base-bias terminal in the initial stage, and a base-bias terminal in an output stage, respectively. Reference numerals Vcc1, Vcc2 denote a collector power supply terminal in the initial stage, and a collector power supply terminal in the output stage, respectively. Cp1, Cp2, Ct1, Ct2, Ci2 an inter-stage matching capacitor, respectively, Lp1, Lt1 an inter-stage matching inductor, respectively, Lb2 denotes a base-bias supply inductor in the output stage, Q4 a bipolar transistor in the output stage, Lc1 a collector power supply inductor in the output stage, OMN an output matching circuit, and RFout an output terminal.

Next, the operation of the present embodiment is described hereinafter. A positive-phase signal and an opposite-phase signal that are delivered from a differential amplifier (not shown) in a preceding stage, differing in phase by 180 degrees from each other, are delivered to the input terminals Rfin1, Rfin2, respectively. The transistors Q1, Q2 make up a differential amplifier to operate such that the sum of respective currents thereof becomes equal in value to a current flowing through the constant current source Q3. The capacitors CP1, Cp2 are π-coupled to the inductor Lp1 while the capacitors Ct1, Ct2 are T-coupled to the inductor Lt1.

In those circuits described, respective phases of the positive-phase signal and the opposite-phase signal are each rotated by ±90 degrees, so that the positive-phase signal and the opposite-phase signal become identical in phase at a junction with the inter-stage matching capacitor Ci2 before being supplied to ci2. That is, circuits comprised of Cp1, Cp2, Lp1, and Ct1, Ct2, Lt1, respectively, are a balun as well as inter-stage matching circuits. A signal having undergone balanced-to-unbalanced conversion is supplied to the output transistor Q4 in the output stage, via the inter-stage matching capacitor Ci2, and an output of Q4 is supplied to the output terminal RFout via the output matching circuit OMN.

Figure 3:
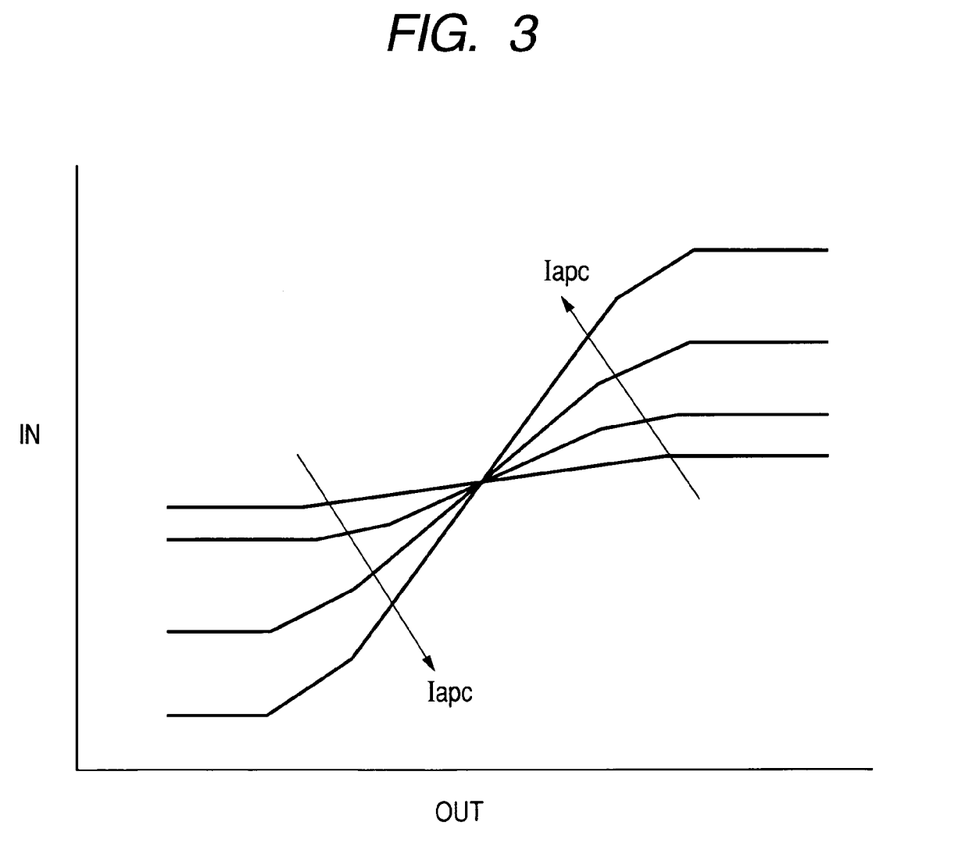
FIG. 3 is a graph showing input-output characteristics of the amplifier according to Embodiment 1.

In this case, as the differential amplifier is provided in the initial stage, and an output thereof is synthesized in the balun, input-output transfer characteristics of the balun indicate characteristics symmetric with respect to a point centering around a bias point as shown in FIG. 3. In FIG. 3, a control bias delivered to the control input terminal Iapc in the initial stage increases in the respective directions of arrows. A graph symmetric with respect to a point is expressed by an odd function, so that the input-output transfer characteristics is expressed by the odd function.

Now, assuming that frequencies of an input signal and a low frequency noise are w0, w1, respectively, a signal voltage Vin delivered to the transistors Q1, Q2, respectively, is represented by the following expression (1):

$$V\text{in} = \exp(jw0t) + \delta \exp(jw1t) \tag{1}$$

where $\delta < 1$

Assuming that an output is Vout, and in the case of taking into account nonlinearity of the input-output transfer characteristics up to a term to the third power, the following expression (2) holds:

$$V\text{out} = A \cdot V\text{in} + B \cdot P\text{in}^3 \tag{2}$$

The following expression (3) is obtained by substituting expression (1) for expression (2):

$$V\text{out} = A\{\exp(jw0t) + \delta\exp(jw1t)\} + B \{\exp(j3w0t) + 3\delta\exp\{j(3w0t+w1)t\} + 3\delta^2\exp\{j(w0t+3w1)t\} + \delta^3\exp\{j(3w1)t\}\} \tag{3}$$

A frequency component appearing in the vicinity of w0 is $3B \cdot \delta^2 \exp\{j(w0t+3w1)t\}$ only, but as this term includes $\delta^2$, it is a negligibly minute term. Consequently, with a power amplifier having the input-output transfer characteristics that can be expressed by the odd function, there occurs no increase in a noise in the Rx band due to mixing of the low frequency noise with the signal. Similar argument holds with reference to a term of a higher order, than the term to the third power, so that without a term of an even-number order, it does not happen that the low frequency noise is mixed with the signal to be thereby converted into the noise in the Rx band.

With the power amplifier according to the present embodiment, a noise in the Rx band was measured, and found at −83 dBm/100 kHz, which was considerably lower than −80 dBm/100 kHz for a noise in the Rx band in the case of an amplifier using no differential stage in the initial stage.

Further, mutual conductance gm of bipolar transistors is proportional to current, and a voltage amplification factor is expressed by (gm multiplied by load resistance). With the power amplifier according to the present embodiment, output control characteristics were measured, whereupon the maximum value of an output control gradient was found at 200 dB/V, which was considerably lower than 500 dB/V in the case of the amplifier using no differential stage in the initial stage.

When a phase angle was varied with load impedance of the power amplifier comprised of a two-stage amplifier, according to the present embodiment, being kept at VSWR 1:9, no oscillation occurred. On the other hand, with a power amplifier of a three-stage configuration comprising an amplifier using substantially identical transistors, in the initial stage, as a single-ended one, oscillation occurred in the vicinity of a specified phase angle. That is, with the present embodiment of the invention, it was possible to obtain highly stable and excellent control characteristics having a low noise as compared with the case of the conventional amplifier.

Further, with the present embodiment, there has been described the circuit using the bipolar transistors, however, the essence of the present invention lies in that the input-output transfer characteristics for the initial stage is expressed by the odd function. As long as this condition is met, it goes without saying that the same advantageous effect as that of the present embodiment can be obtained regardless of whether an amplification element is a MESFET or MOSFET.

Still further, even if the capacitor Cp2 and the capacitors Ct1 are removed from a π-coupled circuit and a T-coupled circuit, each doubling as the inter-stage matching circuit, respectively, to thereby convert either of the circuits into a L-type circuit, it is evident to enable a balun to be implemented by selecting a suitable constant even though a frequency band becomes narrower.

Embodiment 2

Figure 2:
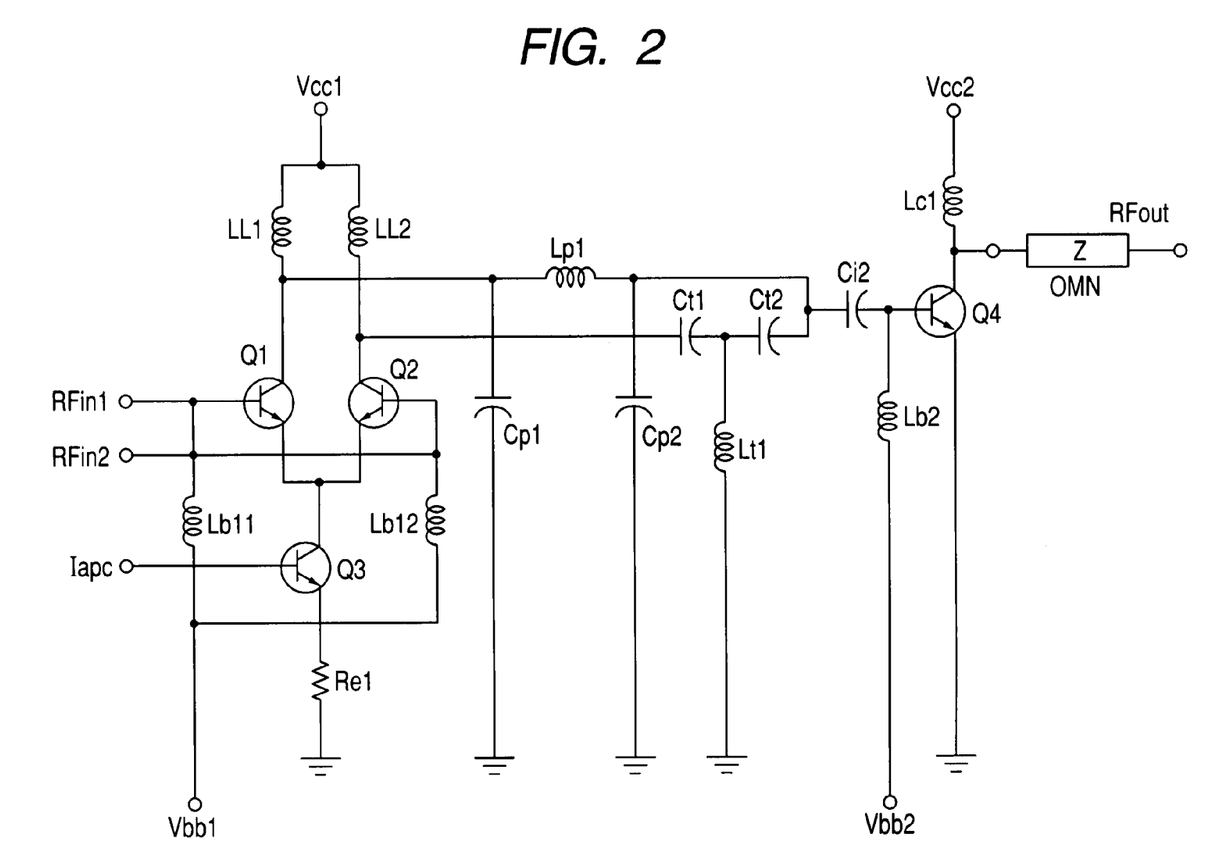
FIG. 2 is a circuit diagram of Embodiment 2 of a high frequency power amplifier according to the invention.

A configuration of Embodiment 2 of a high frequency power amplifier for a differential input, according to the invention, is described with reference to FIG. 2. In FIG. 2, inductors LL1, LL2 are substituted for the resistors RL1, RL2 as the loads in the initial stage of the power amplifier according to Embodiment 1. As a result, efficiency for the initial stage was enhanced such that efficiency at the time of an output at 34 dBm was enhanced to 55% from 52% for the case of Embodiment 1.

Having described the preferred embodiments of the invention as above, it is to be pointed out that the invention is not limited thereto, and various changes and modifications may be obviously made in designing of the invention without departing from the spirit and scope of the invention.

Embodiment 3

Figure 6:
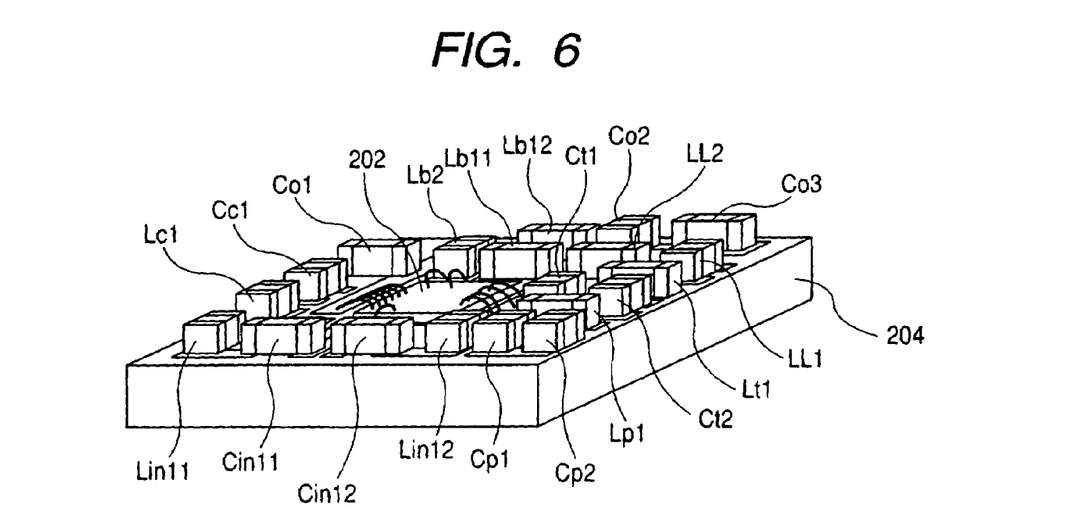
FIG. 6 is a perspective view of a high frequency power amplifier module according to Embodiment 3.

A configuration of Embodiment 3 of the invention is described with reference to FIGS. 6 and 7. FIG. 6 is a perspective view of a high frequency power amplifier module where Embodiment 3 of a high frequency power amplifier according to the invention is made up on one package, and FIG. 7 is a circuit diagram thereof.

Figure 7:
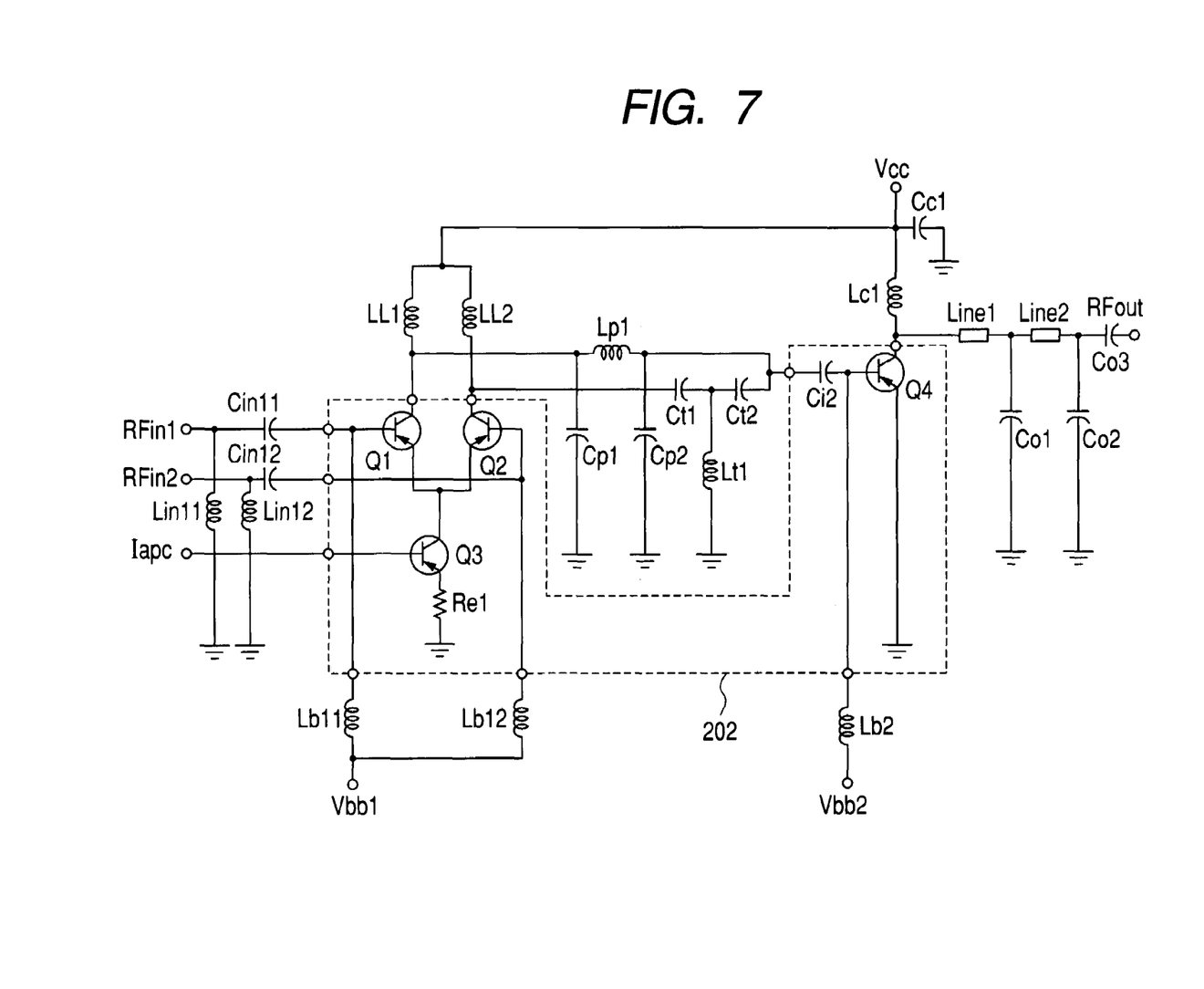
FIG. 7 is a circuit diagram of the high frequency power amplifier module according to Embodiment 3.

In FIGS. 6 and 7, reference numerals Lin11, Lin12 denote an input matching inductor, respectively, Cin11, Cin12 an input matching capacitor, respectively, LL1, LL2 a load inductor, respectively, Cc1 denotes a power supply stabilizing capacitor, Line 1, Line 2 denote an output matching transmission line, respectively, Co1, Co2. Co3 an output matching capacitor, respectively, and 202 denotes an MMIC where amplification transistors, a power source resistor Re1, and a matching capacitor Ci2 are integrated. Circuit components other than those described as above are the same as those in FIG. 1. A portion of the circuits, shown as the output matching circuit OMN in FIG. 1, was comprised of the transmission lines Line 1, Line 2, and the matching capacitors Co1, Co2. Co3. As shown in FIG. 6, those components, as surface mount chip components or the transmission lines using interconnection layers over a module substrate, were mounted, or formed over the module substrate 204 to thereby make up the high frequency power amplifier module. For all the chip components, use is made of a component 0.6×0.3 mm in size, the so-called 0603 component, the MMIC 202 for amplification is 1.2 mm square in size, and the module substrate is made up of a multilayered alumina ceramics in four layers, formed to a thickness of 0.5mm, and 6 mm square in size. The module is resin encapsulated although not shown in FIG. 6, and the module after resin encapsulation is 6×6×1.5 mm in size.

With the present embodiment, there was adopted a configuration in which the transistors Q1 to Q4, making up the amplifier, Ci2 among the inter-stage matching capacitors, and Re1 are integrated over the same substrate where the transistors are mounted to form the MMIC 202, thereby reducing a mount area of the components. Furthermore, by use of the 0603 component for all the chip components, a power amplifier as small as 6×6×1.5 mm in size was implemented.

Since the operation of the present embodiment is the same as that of Embodiment 2, conversion of a low frequency noise delivered from a base-bias terminal Vbb1 into a noise in the Rx band is inhibited upon inductor loads in the initial stage undergoing differential amplification, thereby implementing the noise in the Rx band as low as −83 dBm/100 kHz. Further, as with the case of Embodiment 2, because the inductor loads in the initial stage operate at a high efficiency, an amplifier efficiency as high as 55% was obtained.

With adoption of the configuration of the present embodiment, it is possible to provide a high frequency power amplifier as small as 6×6×1.5 mm in size, with a small noise. Further, with the present embodiment, for a substrate material, use was made of alumina ceramics; however, it is obvious that a similar module can also be made up by use of a multilayered resin substrate, or the like.

Embodiment 4

Figure 8:
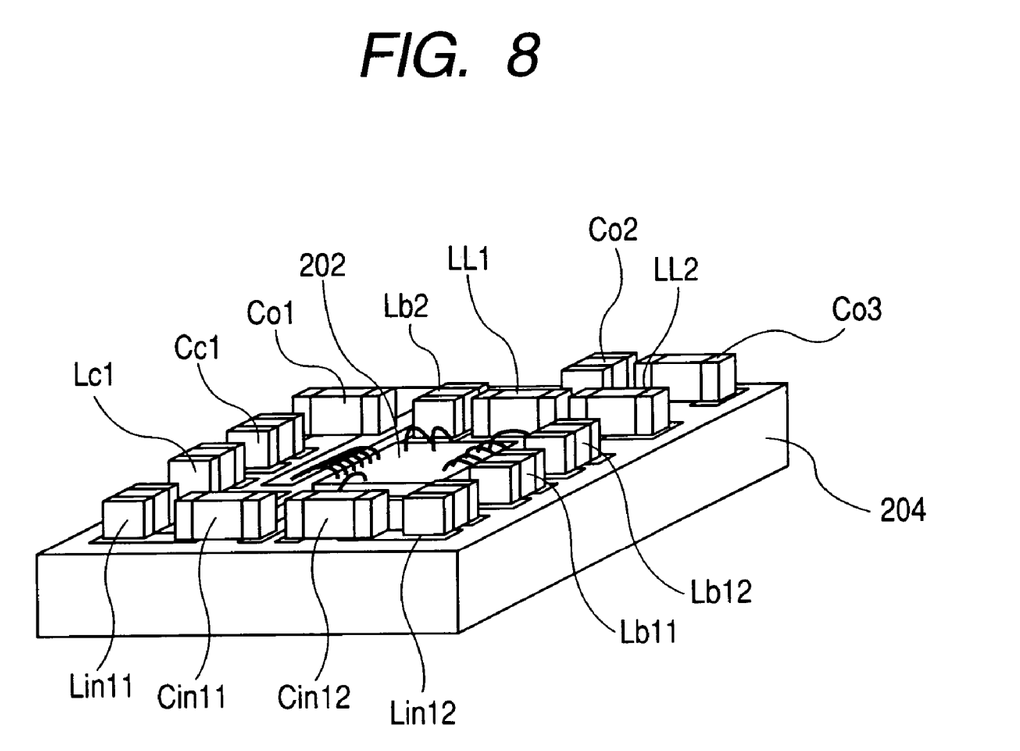
FIG. 8 is a perspective view of a high frequency power amplifier module according to Embodiment 3.

A configuration of Embodiment 4 of the invention is described with reference to FIGS. 8 and 9. FIG. 8 is a perspective view of a high frequency power amplifier module where Embodiment 4 of a high frequency power amplifier according to the invention is made up on one package, and FIG. 9 is a circuit diagram thereof.

Figure 9:
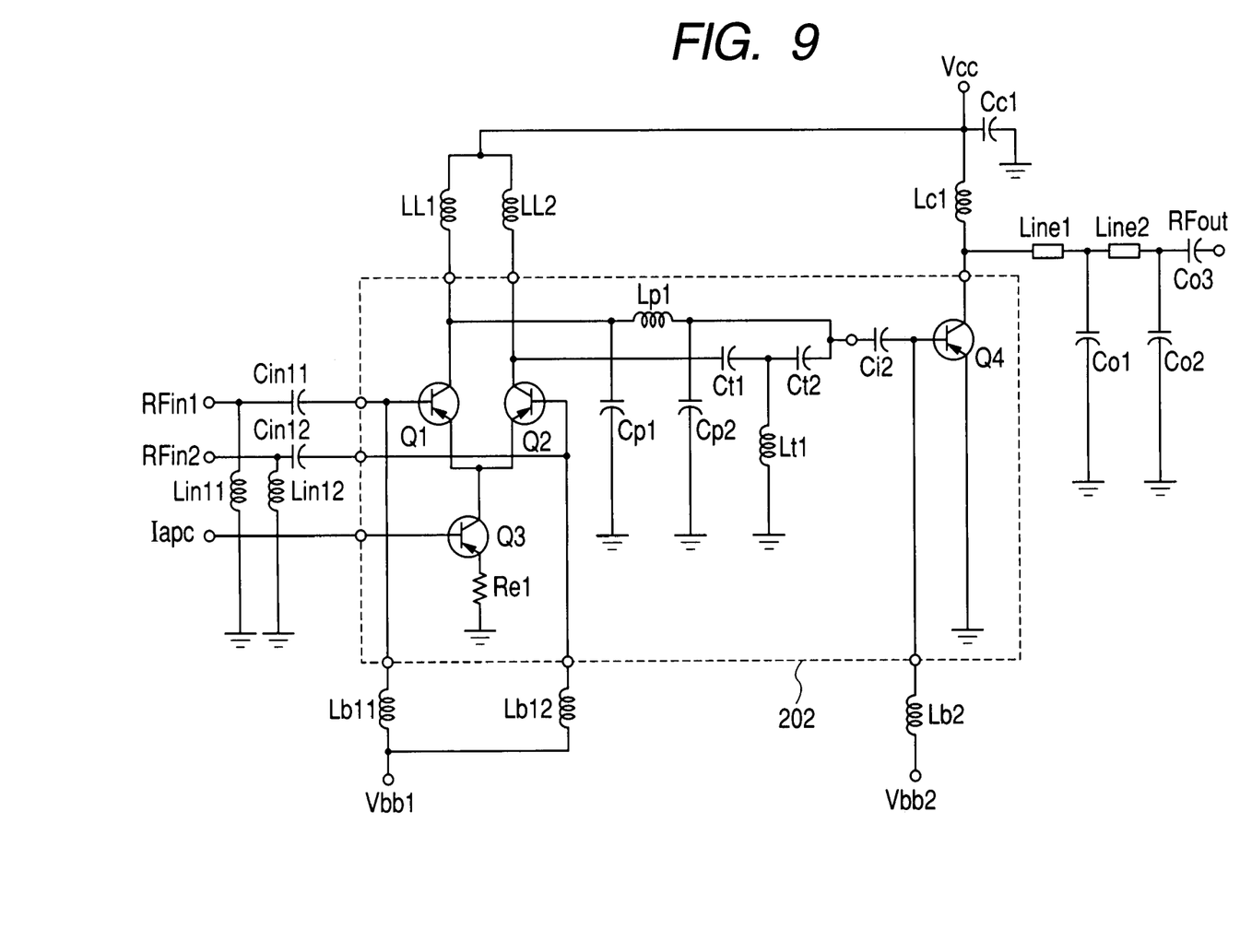
FIG. 9 is a circuit diagram of the high frequency power amplifier module according to Embodiment 4.

With the present embodiment, a balun formed using circuits doubling as inter-stage matching circuits, comprised of Cp1, Cp2, Lp1, and Ct1, Ct2, Lt1, respectively, according to Embodiment 3, are integrated over an MMIC 202 as shown in FIG. 9. With Embodiment 3, those elements are made up of the chip components as shown in FIG. 6, and are disposed outside the MMIC 202. As a result of incorporating those elements inside the MMIC with the present embodiment, the MMIC 202 for amplification becomes larger in size to 1.4 mm square than 1.2 mm square for the case of Embodiment 3; however, the number of components mounted directly over a module substrate 204 is reduced by 6 pieces, so that a module substrate is reduced to 5×6×1.5 mm in size to be rendered smaller than that for Embodiment 3.

Since the operation of the present embodiment is the same as that of Embodiments 2, and 3, respectively, a noise in the Rx band as low as −83 dBm/100 kHz was implemented, and further, an amplifier efficiency as high as 55% was obtained as with the cases of Embodiments 2, and 3.

With adoption of the configuration of the present embodiment, it is possible to provide a high frequency power amplifier as small as 5×6×1.5 mm in size, with a small noise. With the present embodiment, for a substrate material, use was made of alumina ceramics; however, it is obvious that a similar module can also be made up by use of a multilayered resin substrate, or the like.

What is claimed is:

1. A high frequency power amplifier comprising:
   an amplifier in an initial stage, the amplifier comprising a differential amplifier; and
   a balun formed using a plurality of circuits doubling as inter-stage matching circuits and comprised of passive elements, and provided between respective stages of the amplifier in the initial stage,
   wherein the amplifier in a second stage comprises an unbalanced single-ended circuit, and
   wherein a load of the amplifier in the initial stage is an inductance.

2. A high frequency power amplifier comprising:
   an amplifier in an initial stage, the amplifier comprising a differential amplifier; and
   a balun formed using a plurality of circuits doubling as inter-stage matching circuits and comprised of passive elements, and provided between respective stages of the amplifier in the initial stage, wherein the amplifier in a second stage comprises an unbalanced single-ended circuit, and wherein the differential amplifier has an emitter-coupled type configuration for coupling each of two emitters with each other, and output control of the amplifier in the initial stage is executed by means of current of a current source coupled to both the emitters.

3. A high frequency power amplifier comprising:

an amplifier in an initial stage, the amplifier comprising a differential amplifier; and a balun formed using a plurality of circuits doubling as inter-stage matching circuits and comprised of passive elements, and provided between respective stages of the amplifier in the initial stage, wherein the amplifier in a second stage comprises an unbalanced single-ended circuit, and wherein the differential amplifier has a source-coupled type configuration for coupling each of two sources with each other, and output control of the amplifier in the initial stage is executed by means of current of a current source coupled to both the sources.

4. A high frequency power amplifier comprising:

an amplifier in an initial stage, the amplifier comprising a differential amplifier; and a balun formed using a plurality of circuits doubling as inter-stage matching circuits and comprised of passive elements, and provided between respective stages of the amplifier in the initial stage, wherein the amplifier in a second stage comprises an unbalanced single-ended circuit, and wherein the balun formed using a plurality of circuit doubling as the inter-stage matching circuits, comprised of the passive elements, and provided between the respective stages of the amplifier in the initial stage, and the amplifier in the second stage, comprise an inter-stage matching circuits where first and second inter-stage matching capacitors are $\pi$-coupled to a first inter-stage matching inductor, and an inter-stage matching circuit where third and fourth inter-stage matching capacitors are T-coupled to a second inter-stage matching inductor.

* * * * *